United States Patent
Lee et al.

(10) Patent No.: US 9,065,076 B2
(45) Date of Patent: Jun. 23, 2015

(54) ORGANIC LIGHT EMITTING DISPLAY DEVICE AND MANUFACTURING METHOD THEREOF

(71) Applicant: SAMSUNG DISPLAY CO., LTD., Yongin, Gyeonggi-Do (KR)

(72) Inventors: Hyun-Shik Lee, Yongin (KR); Kyu-Seok Kim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/018,912

(22) Filed: Sep. 5, 2013

(65) Prior Publication Data

US 2014/0306193 A1 Oct. 16, 2014

(30) Foreign Application Priority Data

Apr. 15, 2013 (KR) .................. 10-2013-0040926

(51) Int. Cl.
*H01L 51/00* (2006.01)
*H01L 51/52* (2006.01)

(52) U.S. Cl.
CPC ........ *H01L 51/5275* (2013.01); *H01L 51/5268* (2013.01)

(58) Field of Classification Search
CPC ............ H01L 51/5275; H01L 51/5268; H01L 23/293; H01L 23/3135
USPC .............. 257/40, 98, 790, 59, 72; 438/99, 34, 438/127
See application file for complete search history.

(56) References Cited

U.S. PATENT DOCUMENTS

| 2003/0164496 | A1 | 9/2003 | Do et al. |
| 2012/0241771 | A1 | 9/2012 | Kato et al. |
| 2012/0256218 | A1* | 10/2012 | Kwack et al. ................. 257/98 |

FOREIGN PATENT DOCUMENTS

| KR | 10-2003-0070985 A | 9/2003 |
| KR | 10-2012-0044675 A | 5/2012 |
| KR | 10-2012-0108906 A | 10/2012 |

* cited by examiner

*Primary Examiner* — Tu-Tu Ho
(74) *Attorney, Agent, or Firm* — Lee & Morse, P.C.

(57) ABSTRACT

An organic light emitting display device includes a substrate, a display unit on the substrate, and an encapsulation layer on the display unit, the encapsulation layer including a plurality of alternating inorganic and organic films, at least one of the organic films being a patterned organic film, and the patterned organic film having a plurality of high refractive index portions in an organic matrix.

9 Claims, 7 Drawing Sheets

(a)

(b)

(a)  (b)

US 9,065,076 B2

ORGANIC LIGHT EMITTING DISPLAY DEVICE AND MANUFACTURING METHOD THEREOF

CROSS-REFERENCE TO RELATED APPLICATION

Korean Patent Application No. 10-2013-0040926, filed on Apr. 15, 2013, in the Korean Intellectual Property Office, and entitled: "ORGANIC LIGHT EMITTING DISPLAY DEVICE AND MANUFACTURING METHOD THEREOF," is incorporated by reference herein in its entirety.

TECHNICAL FIELD

The present disclosure relates to an organic light emitting display device and a manufacturing method thereof. More particularly, the present disclosure relates to an organic light emitting display device with a patterned organic film in a thin film encapsulation layer, thereby increasing light extraction efficiency, and to a manufacturing method thereof.

BACKGROUND

An organic light emitting display device is a self-emission display device which has an organic light emitting diode that emits light to display an image. Since the organic light emitting display device does not require a separate light source, unlike a liquid crystal display, it is possible to reduce a thickness and a weight thereof, e.g., as compared to the liquid crystal display. Further, the organic light emitting display device exhibits low power consumption, high luminance, and rapid response speed.

The organic light emitting diode of the organic light emitting display device may include a hole injection electrode, an organic emission layer, an electron injection electrode, and a thin film encapsulation layer. In the organic light emitting diode, a hole supplied from the hole injection electrode and an electron supplied from the electron injection electrode are coupled with each other in the organic emission layer to form an exciton, and light is generated by energy generated when the exciton falls to a ground state.

SUMMARY

The present disclosure has been made in an effort to provide an organic light emitting display device and a manufacturing method thereof with improved light extraction efficiency by forming a patterned organic film in an encapsulation layer to reduce total internal reflection generated in the organic light emitting display device.

An exemplary embodiment of the present disclosure provides an organic light emitting display device including a substrate, a display unit on the substrate, and an encapsulation layer on the display unit, the encapsulation layer including a plurality of alternating inorganic and organic films, at least one of the organic films being a patterned organic film, and the patterned organic film having a plurality of high refractive index portions in an organic matrix.

The organic matrix may include an organic material having a refractive index of about 1.45 to about 1.5.

The high refractive index portions may have a refractive index of about 1.5 to about 1.6.

The high refractive index portions may have a shape of a cylinder, a prism, a convex lens, a concave lens, or a line.

The encapsulation layer may include at least two patterned organic films.

The at least two patterned organic films may be separated by one inorganic film, and the high refractive index portions in each of the at least two patterned organic films are line shaped, the high refractive index portion in an upper patterned organic film of the at least two patterned organic films are perpendicular to the high refractive index portion in a lower patterned organic film of the two patterned organic films.

The organic matrix and the high refractive index portions may include a same material.

The display unit may include a first electrode on the substrate, an emission layer on the first electrode, and a second electrode on the emission layer.

The organic light emitting display device may further include a capping layer between the display unit and the encapsulation layer.

An exemplary embodiment of the present disclosure also provides a manufacturing method of an organic light emitting display device, the method including forming a display unit on a substrate, and forming an encapsulation layer on the display unit by forming a plurality of alternating inorganic and organic films, and at least one of the organic films being formed by selective light irradiation after the organic film is coated.

The selective light irradiation may include irradiating light through a half tone mask.

The selective light irradiation may include irradiating light from at least two light sources, such that intensity of light incident on the organic film changes due to constructive and destructive interference of light from the at least two light sources to perform the selective light irradiation.

Forming the organic films may include uniformly coating the organic films with the same material.

The selective light irradiation may be performed at least through a first mass and through a second mask, the first mask having a slit shape in a first direction, and the second mask having a slit shape in a second direction crossing the first direction.

DETAILED DESCRIPTION

Figure 1:
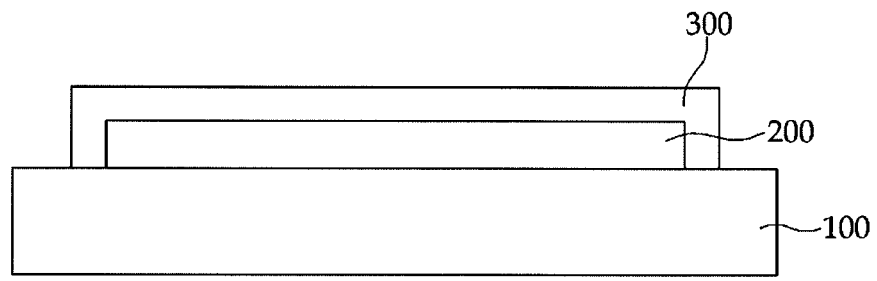
FIG. 1 is a cross-sectional view illustrating an organic light emitting display device according to an exemplary embodiment of the present disclosure.

Hereinafter, exemplary embodiments of the present disclosure will be described in more detail with reference to the accompanying drawings. However, the scope of the present disclosure is not limited to the following examples and drawings. Exemplary embodiments to be described below and illustrated in the drawings may include various equivalences and modifications.

The terminology used in this specification is terms used in order to express the exemplary embodiments of the present disclosure and may depend on the intention of users or operators or the custom in the art to which the present disclosure belongs. Accordingly, the terminology needs to be defined based on details throughout this specification.

For reference, respective components and shapes thereof may be schematically drawn or exaggeratedly drawn in the accompanying drawings for easy understanding. Like reference numerals designate like elements throughout the drawings. Further, it will be understood that when a layer or an element is described as being "on" another layer or element, it may be directly disposed on another layer or element, or an intervening layer or element may also be present.

FIG. 1 is a cross-sectional view illustrating an organic light emitting display device according to an exemplary embodiment of the present disclosure.

Referring to FIG. 1, the organic light emitting display device according to the exemplary embodiment of the present disclosure may include a substrate 100, a display unit 200, and an encapsulation layer 300.

The substrate 100 may be made of various materials, e.g., a glass substrate, a quartz substrate, and/or a transparent resin substrate, and may be formed by using a flexible material. For example, a transparent resin substrate, which is usable as the substrate 100, may contain, e.g., a polyimide resin, an acrylic resin, a polyacrylate resin, a polycarbonate resin, a polyether resin, a polyethylene terephthalate resin, a sulfonic acid resin, and the like.

In a case that the organic light emitting display device is a bottom emission type, i.e., when an image is displayed toward the substrate 100, the substrate 100 is made of a light transmitting material. In the case that the organic light emitting display device is a top emission type, i.e., when an image is displayed toward the encapsulation layer 300, the substrate 100 may not necessarily be made of a light transmitting material.

Figure 8:
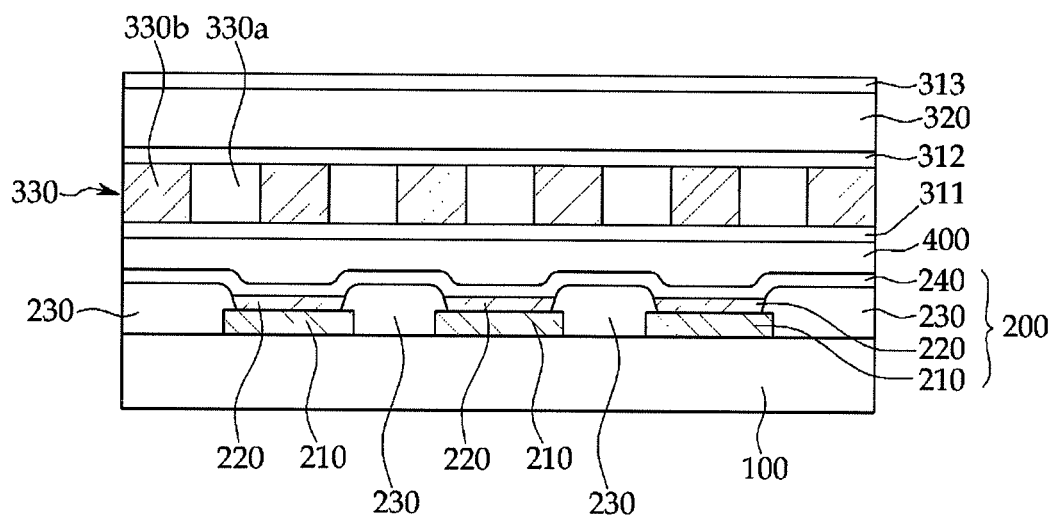
FIG. 8 is a diagram illustrating the organic light emitting display device illustrated in FIG. 2 in more detail.

The display unit 200 may include an emission layer 220 (FIG. 8). The configuration of the display unit 200 will be described below with reference to FIG. 8.

Figure 4:
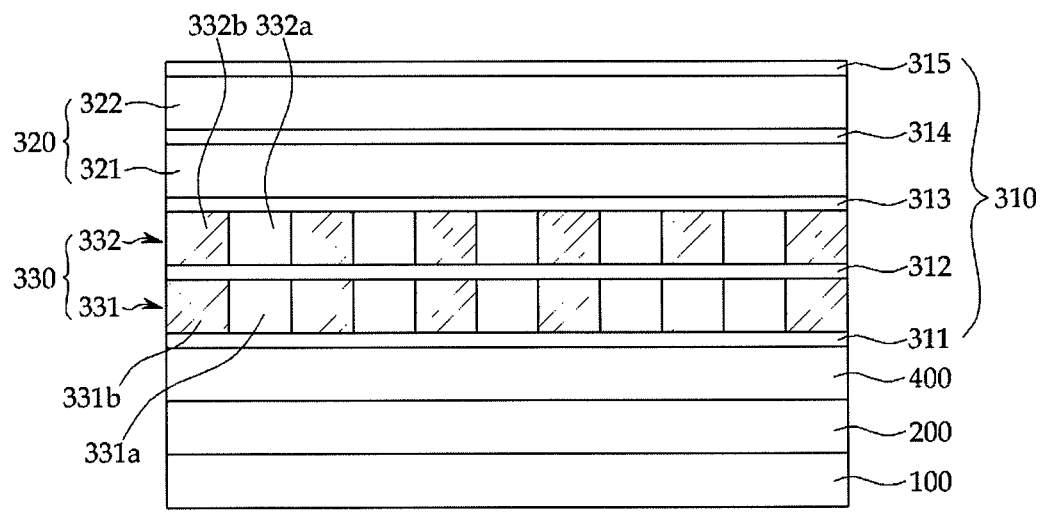
FIG. 4 is a diagram illustrating an organic light emitting display device including a patterned organic film according to another exemplary embodiment of the present disclosure.

The encapsulation layer 300 may include alternately laminated organic films 320 and inorganic films 310 (FIG. 4). The configuration of the encapsulation layer 300 will be explained in more detail below with reference to FIG. 4.

Figure 2:
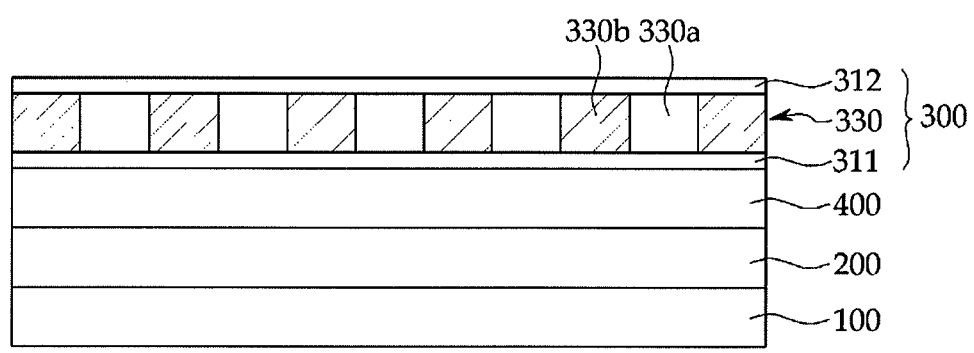
FIG. 2 is a diagram illustrating an organic light emitting display device including a patterned organic film according to the exemplary embodiment of the present disclosure.

FIG. 2 is a diagram illustrating a detailed organic light emitting display device according to the exemplary embodiment of the present disclosure.

Referring to FIG. 2, the organic light emitting display device according to the exemplary embodiment of the present disclosure may include the substrate 100, the display unit 200 formed on the substrate 100, and the encapsulation layer 300 formed on the display unit 200. As discussed previously, the encapsulation layer 300 may include a plurality of inorganic films 310 and a plurality of organic films 320 (FIG. 4), and the plurality of inorganic films 310 and the plurality of organic films 320 may be alternately laminated. The laminated number of the organic films 320 and the inorganic films 310 may be set by considering external light extraction efficiency and the like.

When a conventional organic light emitting display device includes a conventional encapsulation layer, which includes a multilayered structure, an optical characteristic of the conventional organic light emitting display device may deteriorate. That is, the conventional multilayered structure includes a plurality of organic and inorganic films with different refractive indices, so part of the light generated by an emission layer in the display unit may be restricted by internal total reflection, i.e., due to the different refractive indices, followed by dissipation.

Therefore, in order to prevent the light extraction efficiency from deteriorating, in the present disclosure, as illustrated in FIG. 2, a patterned organic film 330 may be included in the encapsulation layer 300. The patterned organic film 330 may be formed of at least one of the plurality of organic films 320, so the laminated structure of the alternating inorganic and organic films 310 and 320 of the encapsulation layer 300 may include the patterned organic film 330 instead of one of the organic films 320. For example, a first inorganic film 311, the patterned organic film 330, and a second inorganic film 312 may be formed, e.g., sequentially and directly on top of each other, on the display unit 200. The patterned organic film 330 may include a plurality of high refractive index portions 330b dispersed in a matrix 330a, which is made of an organic material.

In detail, the plurality of organic films 320 is relatively thick to prevent moisture vapor transmission and to provide planarization. In order to prevent the thick organic films 320 from flowing, formation of the organic film 320 may include coating an organic material 330' (FIG. 10D) on an inorganic film, followed by ultraviolet light irradiation and curing of the organic material 330' to form the organic film 320. A selective ultraviolet light irradiation, i.e., varying an amount of irradiated light in accordance with a position on the organic film, may be performed on at least one of the organic films 320 in order to form the patterned organic film 330, i.e., by the selective light irradiation.

In further detail, the coated organic material 330' has the property that a refractive index thereof increases as the amount of the ultraviolet light irradiation thereon increases. Accordingly, the patterned organic film 330 of the present disclosure may vary a refractive index of, e.g., an internal, region of the organic material 330' by locally differentiating between the amounts of the ultraviolet light irradiation during the curing process. For example, a region where the amount of ultraviolet light irradiation is small may define the matrix 330a, which is made of an organic material, and a region where the amount of ultraviolet light irradiation is large may define the high refractive index portions 330b in the matrix 330a.

For example, a refractive index of the matrix 330a, which is made of an organic material, may be about 1.45 to about 1.5, and a refractive index of the plurality of high refractive index portions 330b may be about 1.5 to about 1.6. Accordingly, due to the difference in a refractive index of the matrix 330a, which is made of an organic material, and the plurality of high refractive index portions 330b, light generated by the emission layer of the display unit 200 may be scattered and diffracted.

Figure 3:
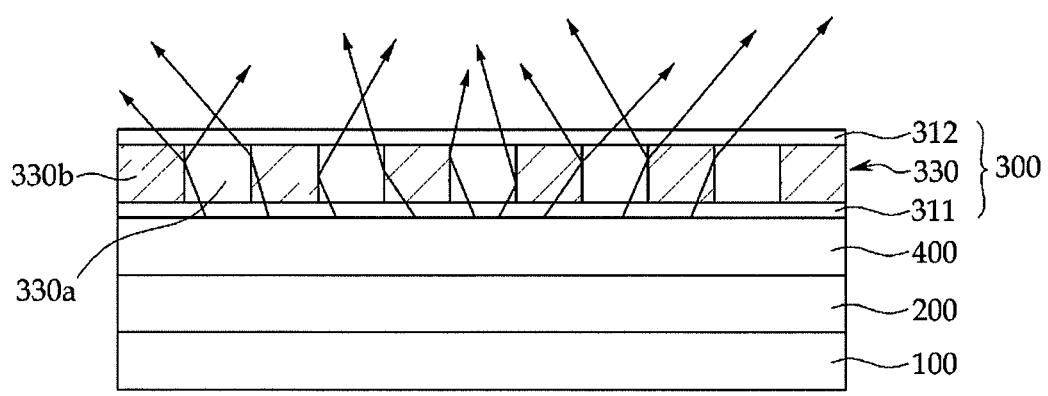
FIG. 3 is a diagram illustrating reflection and refraction of light appearing on an interface of a high refractive index portion of a patterned organic film according to the exemplary embodiment of the present disclosure.

FIG. 3 is a diagram illustrating reflection and refraction of light at an interface of the high refractive index portion 330b of the patterned organic film 330 according to the exemplary embodiment of the present disclosure. As illustrated in FIG. 3, scattering and diffraction of light occur at the interface of the plurality of high refractive index portions 330b with the matrix 330a.

In detail, the matrix 330a and the high refractive index portions 330b may be made of the same material. Since the patterned organic film 330 has a structure in which a refractive index for each region varies depending on the amount of ultraviolet light irradiation after the patterned organic film 330 is formed of the same organic material 330', the patterned organic film 330 may be made of the same material, and a difference in degree of polymerization and the like may occur.

FIG. 4 is a diagram illustrating an organic light emitting display device including a patterned organic film according to another exemplary embodiment of the present disclosure.

Referring to FIG. 4, the patterned organic film 330 may be formed at least twice or more, i.e., first and second patterned organic films 331 and 332. For example, the display unit 200 may be formed on the substrate 100, and a capping layer 400 may be formed on the display unit 200. The first inorganic film 311 may be formed on the capping layer 400, the first patterned organic film 331 may be formed on the first inorganic film 311, the second inorganic film 312 may be formed on the first patterned organic film 331, and the second patterned organic film 332 may be formed on the second inorganic film 312. Further, a third inorganic film 313, a first organic film 321, a fourth inorganic film 314, a second organic film 322, and a fifth inorganic film 315 may be sequentially laminated. Each of the first and second patterned organic films 331 and 332 has a substantially same structure as that of the patterned organic film 330 in FIG. 2. It is possible to improve light extraction efficiency by forming the patterned organic film 330 at least twice or more.

Figure 5:
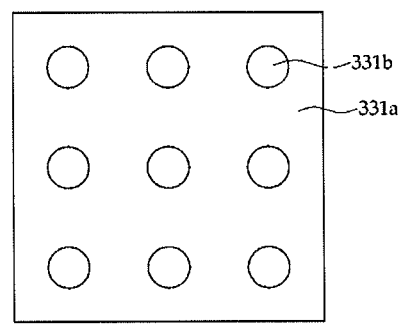
FIG. 5 is a plan view of a patterned organic film according to the exemplary embodiment of the present disclosure.
Figure 5:
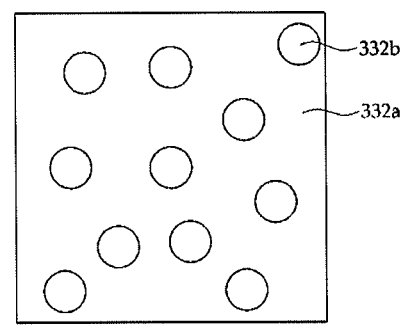

FIG. 5 illustrates plan views of the first and second patterned organic films 331 and 332 of FIG. 4. Referring to FIG. 5, high refractive index portions 331b and 332b of the patterned organic films 331 and 332, respectively, may have any suitable shape, e.g., a cylinder, a prism, a convex lens, or a concave lens.

Further, the high refractive index portion 330b of the patterned organic film 330 may be dispersed regularly or irregularly in the matrix 330a, which is made of an organic material. For example, referring to FIG. 5, the first high refractive index portion 331b of the first patterned organic film 331 may be regularly dispersed in a first matrix 331a, which is made of an organic material, in the shape of a cylinder, and the second high refractive index portion 332b of the second patterned organic film 332 may be irregularly dispersed in a second matrix 332a, which is made of an organic material, in the shape of a cylinder, e.g., a circle.

Figure 6:
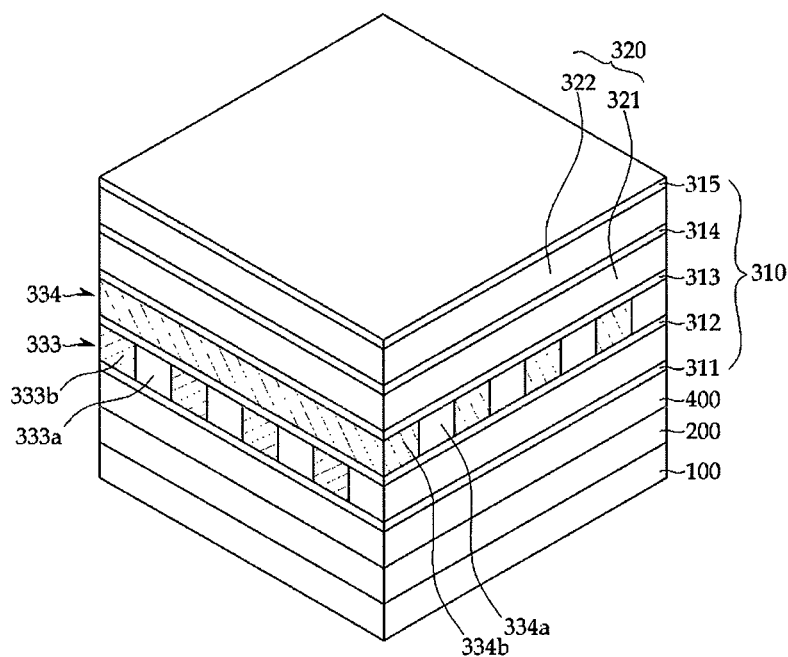
FIG. 6 is a diagram illustrating an organic light emitting display device including a patterned organic film according to yet another exemplary embodiment of the present disclosure.
Figure 7:
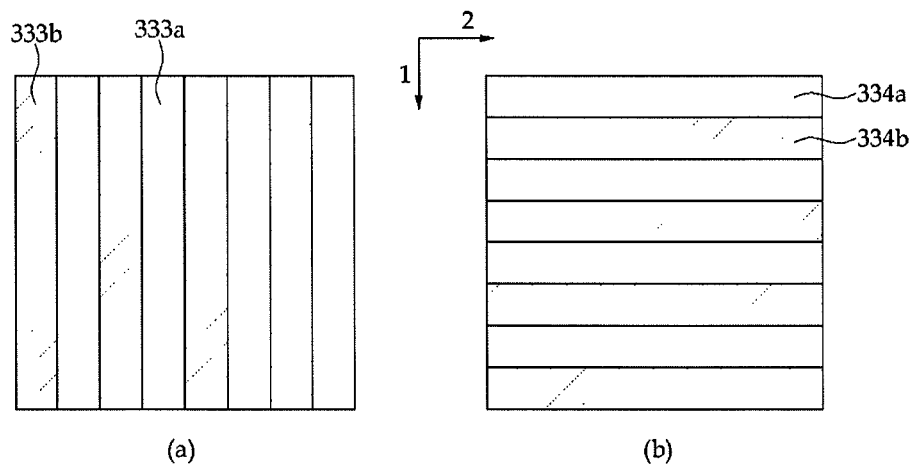
FIG. 7 is a plan view of a patterned organic film according to yet another exemplary embodiment of the present disclosure.

FIG. 6 is a diagram illustrating an organic light emitting display device including two patterned organic films according to yet another exemplary embodiment of the present disclosure. FIG. 7 illustrates plan views of the two patterned organic films in FIG. 6.

Referring to FIGS. 6 and 7, an organic light emitting display device according to another embodiment may include two patterned organic films 333 and 334 with the second inorganic film 312 therebetween. The high refractive index portions of each of the two patterned organic films 333 and 334, i.e., high refractive index portions 333b and 334b, are formed by a line type. Further, the high refractive index portion 333b included in the lower patterned organic film 333 of the two patterned organic films 330 and the high refractive index portion 334b included in the upper patterned organic film 334 of the two patterned organic films 330 may be disposed to cross each other.

For example, the first inorganic film 311 may be formed on the capping layer 400, and a third patterned organic film 333, i.e., the lower patterned organic film 333, may be formed on the first inorganic film 311. The second inorganic film 312 may be formed on the third patterned organic film 333, and a fourth patterned organic film 334, i.e., the upper patterned organic film 334, may be formed on the second inorganic film 312. Further, the third inorganic film 313, the first organic film 321, the fourth inorganic film 314, the second organic film 322, and the fifth inorganic film 315 may be sequentially laminated on the fourth patterned organic film 334.

The third patterned organic film 333 may be made of a third matrix 333a, which is made of an organic material, and a third line-type high refractive index portion 333b. The fourth patterned organic film 334 may be made of a fourth matrix 334a, which is made of an organic material, and a fourth line-type high refractive index portion 334b. The high refractive index portions 333b and 334b may have a shape like a slit when viewed from above, as illustrated in FIG. 7. That is, the line-type may be a long slit having a predetermined height and thickness. Accordingly, each of the matrices 333a and 343a, which are made of an organic material, and the corresponding high refractive index portions 333b and 334b may be repeated in an elongated slit shape.

The third high refractive index portion 333b and the fourth high refractive index portion 334b may be formed to cross each other when viewed from above. As illustrated in FIG. 7, the third high refractive index portion 333b may be formed along a first direction, and the fourth high refractive index portion 334b may be formed along a second direction orthogonal to the first direction. Accordingly, the third high refractive index portion 333b and the fourth high refractive index portion 334b may be orthogonal to each other, and scattering and diffraction of light generated in the emission layer 220 of the display unit 200 may increase. An angle, at which the third high refractive index portion 333b and the fourth high refractive index portion 334b cross each other, may be formed in various manners.

The thin film materials, which are usable as the inorganic film 310, the organic film 320, and the patterned organic film 330, and a laminating method of the inorganic film 310, the organic films 320, and the patterned organic film 330 may be any suitable materials and methods.

For example, the thin film material which is usable as the inorganic film 310 may contain, e.g., at least one of silicon nitride, aluminum nitride, zirconium nitride, titanium nitride, hafnium nitride, tantalum nitride, silicon oxide, aluminum oxide, and titanium oxide. The thin film material which is usable as the organic film 320 may contain, e.g., at least one of epoxy, acrylate, urethane acrylate, polyurea, polyacrylate, PTCDA, BPDA, and PMDA. The patterned organic film 330 may be formed by using any suitable thin film material of the organic film 320 which is usable as ultraviolet light curing resin.

The inorganic film 310 and the organic film 320 may be formed by using, e.g., a spin coating process, a printing process, a sputtering process, a chemical vapor deposition (CVD) process, an atomic layer deposition (ALD) process, a plasma enhanced chemical vapor deposition (PECVD) process, a high density plasma-chemical vapor deposition (HDP-CVD) process, a vacuum deposition process, and the like, according to a material for forming the encapsulation layer 300.

Referring back to FIG. 6, the capping layer 400 may be disposed between the display unit 200 and the encapsulation layer 300. The capping layer 400 may be made of, e.g., a transparent material having ultraviolet light absorbing capacity.

FIG. 8 is a detailed diagram of the organic light emitting display device in FIG. 2.

Referring to FIG. 8, the display unit 200 may include a first electrode 210 formed on the substrate 100, a pixel defining layer (PDL) 230 formed between the first electrodes 210, the emission layer 220 formed on the first electrode 210, and a second electrode 240 formed on the emission layer 220. The first electrode 210 and the second electrode 240 may contain any suitable materials.

In the case where the organic light emitting display device is a top emission type, the first electrode 210 may contain at least one of gold (Au), platinum (Pt), nickel (Ni), tungsten (W), chromium (Cr), molybdenum (Mo), iron (Fe), cobalt (Co), copper (Cu), palladium (Pd), titanium (Ti), and a compound thereof. In addition, the second electrode 240 may contain at least one of indium tin oxide (ITO) and indium zinc oxide (IZO), which are transparent conductive oxides.

In the case where the organic light emitting display device is a bottom emission type, the first electrode 210 may contain at least one of indium tin oxide (ITO) and indium zinc oxide (IZO), which are transparent conductive oxides having a high work function. In addition, the second electrode 240 may be made of metal having a low work function, such as an alkali metal, e.g., lithium (Li) and/or cesium (Cs), alkaline earth metal, e.g., magnesium (Mg), calcium (Ca), and/or strontium (Sr), and a compound thereof.

The emission layer 220 may include a red emission layer, a green emission layer, and a blue emission layer. The emission layer 220 may be made of a low molecular organic material or a high molecular organic material.

The pixel defining layer 230 may be made of a material having an insulation property to partition the first electrodes 210 into pixels. In detail, the pixel defining layer 230 is disposed at an edge of the first electrode 210 to partition the first electrodes 210 by a pixel and define pixel areas. The pixel defining layer 230 covers the edge of the first electrode 210.

Figure 9A:
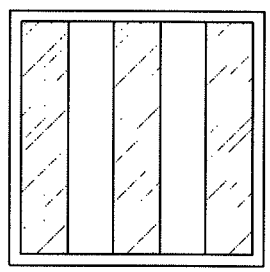
FIG. 9a is a diagram illustrating a slit-shaped mask according to the exemplary embodiment of the present disclosure.
Figure 9B:
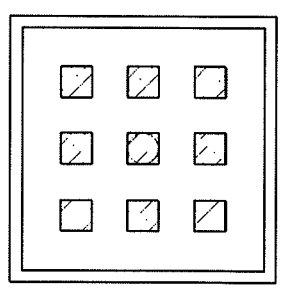
FIG. 9b is a diagram illustrating a quadrangular-shaped mask according to the exemplary embodiment of the present disclosure.
Figure 9C:
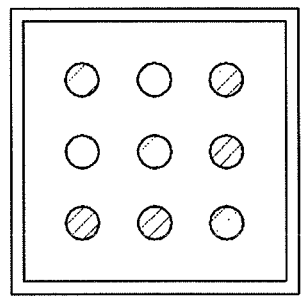
FIG. 9c is a diagram illustrating a circle-shaped mask having a regular distribution according to the exemplary embodiment of the present disclosure.
Figure 9D:
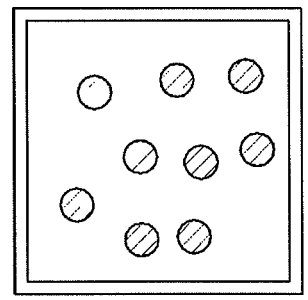
FIG. 9d is a diagram illustrating a circle-shaped mask having an irregular distribution according to the exemplary embodiment of the present disclosure.

FIG. 9a is a diagram illustrating a slit-shaped mask according to the exemplary embodiment of the present disclosure. FIG. 9b is a diagram illustrating a quadrangular-shaped mask according to the exemplary embodiment of the present disclosure. FIG. 9c is a diagram illustrating a circle-shaped mask having a regular distribution according to the exemplary embodiment of the present disclosure. FIG. 9d is a diagram illustrating a circle-shaped mask having an irregular distribution according to the exemplary embodiment of the present disclosure. FIGS. 10a-10f are diagrams illustrating stages in a manufacturing process of the organic light emitting display device according to the exemplary embodiment of the present disclosure.

Referring to FIGS. 9a-10f, another exemplary embodiment of the present disclosure provides a manufacturing method of the organic light emitting display device. That is, the manufacturing method may include forming the display unit 200 on the substrate 100, and forming the encapsulation layer 300 on the display unit 200.

Forming of the encapsulation layer 300 may include alternately forming the organic films 320 and the inorganic films 310. When forming the organic films 320, at least one organic film may be treated for a selective light irradiation after the organic film is coated.

In performing the selective light irradiation, a half tone mask 500 (FIG. 10D) may be used. The half tone mask 500 may control the amount of light irradiation, and the half tone mask 500 may be any one of a slit-shaped mask 501, a quadrangular-shaped mask 502, a circle-shaped mask 503 having a regular distribution, a circle-shaped mask 504 having an irregular distribution, and the like (FIGS. 9a-9d). In FIGS. 9a-9d and 10D, a dark portion of the slit shape, the quadrangular shape, and the circle shape in the half tone mask 500 may transmit more light, and the remaining white portion may transmit less light. The four masks given as an example of the half tone mask 500 are only exemplified, and those skilled in the art can use a modified half tone mask when necessary.

The half tone mask 500 may be disposed above an organic material 330' to be patterned, and light may be fully irradiated to the organic material 330' through the half tone mask 500. Meanwhile, when performing the selective light irradiation, light is irradiated by more than two light sources. Therefore, intensity of light incident on the organic material 330' may change according to constructive or destructive interference of the more than two light sources, so that the selective light irradiation may be performed. That is, the patterned organic film 330 may be formed by controlling interference of light without a mask.

The light irradiation type using the interference of the light may be a kind of hologram lithography. The hologram lithography is a technique of forming a pattern by multibeam interference. For example, in the case of two beam interference, an area where intensity of light increases by constructive interference occurring when lights irradiated in two directions overlap and another area where intensity of light is zero by destructive interference may be periodically produced. In the case of multibeam interference, many lights overlap one another and a circular shape or a specific shape may be embodied.

Meanwhile, performing the selective light irradiation may be conducted at least twice, and the selective light irradiation may be performed by disposing a slit-shaped mask in one direction over the organic film, and thereafter by disposing another slit-shaped mask in a different direction crossing the one direction over the organic film. Specifically, the organic film 320 is first coated. The slit-shaped mask in one direction is disposed over the organic film 320, and then the selective light irradiation is performed. The inorganic film 310 is formed on the patterned organic film 330 which is formed by the selective light irradiation, and thereafter another organic film 320 is coated again on the inorganic film 310. After that, a slit-shaped mask in different direction crossing the one direction is disposed above the other organic film 320 so as to perform the selective light irradiation. For example, as illustrated in FIG. 7, the third patterned organic film 333 and the fourth patterned organic film 334 may be formed. Meanwhile, the patterned organic film 330 may be uniformly coated with the same material.

Figure 10A:
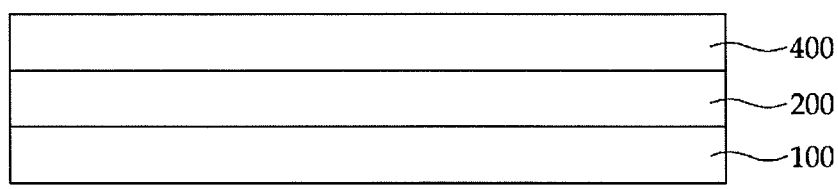
FIGS. 10a through 10f are diagrams illustrating stages in a manufacturing process of an organic light emitting display device according to the exemplary embodiment of the present disclosure.

Referring to FIGS. 10a-10f, an exemplary embodiment of the manufacturing method of the organic light emitting display device including the patterned organic film 330 is as follows. The display unit 200 is first formed on the substrate 100, and then the capping layer 400 may be formed on the display unit 200 (FIG. 10a).

Figure 10B:
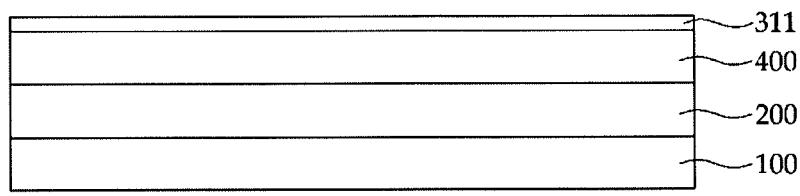
Figure 10C:
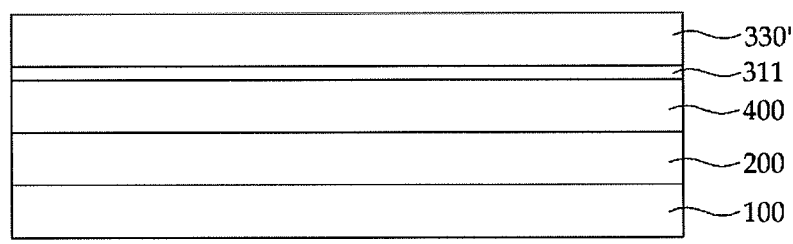
Figure 10D:
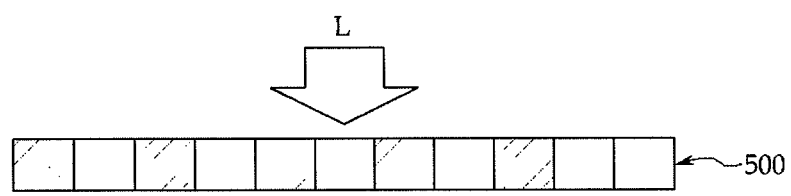
Figure 10D:
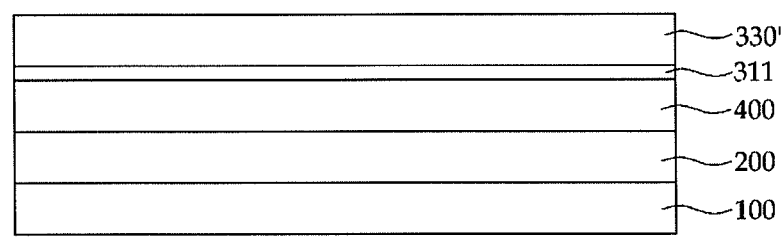

After that, the first inorganic film 311 may be formed on the capping layer 400 (FIG. 10b). The organic material 330' is coated on the first inorganic film 311 (FIG. 10c), followed by disposing the half tone mask 500 above the organic material 330' so that light may be irradiated (FIG. 10d). Then, the patterned organic film 330 may be formed on the first inorganic film 311.

Figure 10E:
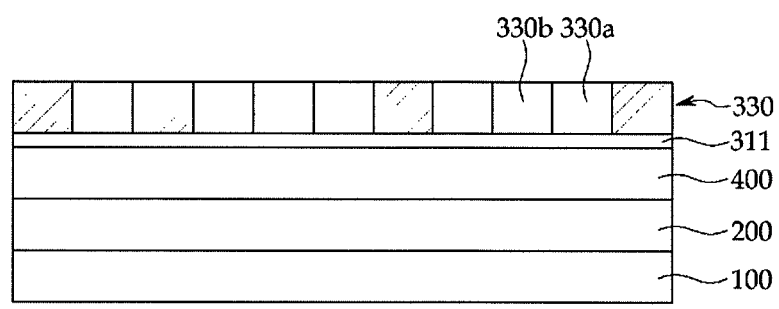
Figure 10F:
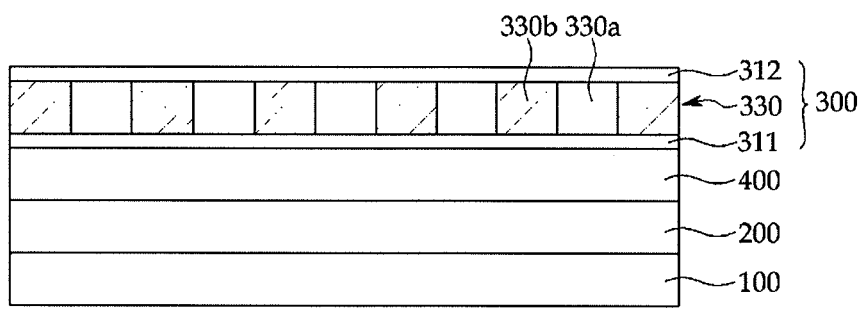

The patterned organic film 330 may include the matrix 330a which is made of an organic material and the plurality of the high refractive index portions 330b due to the selective light irradiation (FIG. 10e). The second inorganic film 312 may be formed on the patterned organic film 330 (FIG. 10f).

According to the exemplary embodiments of the present disclosure, it is possible to improve light extraction efficiency to the outside and reduce power consumption, by disposing a patterned organic film in an encapsulation layer. As described above, the organic light emitting display device and the manufacturing method thereof are only exemplified, and those skilled in the art can understand that the scope of the present disclosure may include various modifications and equivalent embodiments therefrom.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An organic light emitting display device, comprising:
   a substrate;
   a display unit on the substrate; and
   an encapsulation layer on the display unit, the encapsulation layer including a plurality of alternating inorganic and organic films, at least one of the organic films being a patterned organic film, and the patterned organic film having a plurality of high refractive index portions in an organic matrix,
   wherein the high refractive index portions include an organic material.

2. The organic light emitting display device of claim 1, wherein the organic matrix includes an organic material having a refractive index of about 1.45 to about 1.5.

3. The organic light emitting display device of claim 1, wherein the high refractive index portions have a refractive index of about 1.5 to about 1.6.

4. The organic light emitting display device of claim 1, wherein the high refractive index portions have a shape of a cylinder, a prism, a convex lens, a concave lens, or a line.

5. The organic light emitting display device of claim 1, wherein the encapsulation layer includes at least two patterned organic films.

6. The organic light emitting display device of claim 5, wherein:
   the at least two patterned organic films are separated by one inorganic film, and
   the high refractive index portions in each of the at least two patterned organic films are line shaped, the high refractive index portion in an upper patterned organic film of the at least two patterned organic films and the high refractive index portion in a lower patterned organic film of the two patterned organic films are disposed to intersect each other.

7. The organic light emitting display device of claim 1, wherein the organic matrix and the high refractive index portions include a same material.

8. The organic light emitting display device of claim 1, wherein the display unit includes a first electrode on the substrate, an emission layer on the first electrode, and a second electrode on the emission layer.

9. The organic light emitting display device of claim 1, further comprising a capping layer between the display unit and the encapsulation layer.

* * * * *